United States Patent [19]

Martin

[11] Patent Number: 5,149,987

[45] Date of Patent: Sep. 22, 1992

[54] PROVISION OF CIRCUIT RESET WITHOUT A DEDICATED I/O PIN

[75] Inventor: William C. Martin, Carrollton, Tex.

[73] Assignee: VLSI Technology, Inc., San Jose, Calif.

[21] Appl. No.: 747,892

[22] Filed: Aug. 19, 1991

[51] Int. Cl.$^5$ .......................................... H03K 19/003
[52] U.S. Cl. .................................. 307/272.3; 307/443
[58] Field of Search ...................... 307/272.3, 443, 475, 307/241, 242, 571, 572, 608, 296.1, 296.8

[56] References Cited

U.S. PATENT DOCUMENTS 5,051,611 9/1991 Kantz .............................. 307/272.3

Primary Examiner—David Mis
Attorney, Agent, or Firm—Douglas L. Weller

[57] ABSTRACT

An electronic device is reset using a reset line internal to the electronic device. The electronic device includes internal logic circuitry which performs logic operations. An internal logic power signal input to the electronic device is connected to an internal logic power signal line. The internal logic power signal line is used to deliver an internal logic power signal to the internal logic circuitry. The electronic device also includes a plurality of outputs. A plurality of output drivers buffer output signals generated by the internal logic circuitry. The output drivers place the output signals on the plurality of outputs. The electronic device additionally includes an output power signal input connected to an output power signal line. The output power signal line is used to deliver an output power signal from the output power signal input to the output drivers. A reset line, connected to the output power signal line and to the internal logic circuitry, is used to reset the internal logic circuitry. A reset cycle is begun by placing the internal logic power signal on the internal logic power signal line while placing a ground signal on the output power signal line. The reset cycle is completed by placing the output power signal on the output power signal line.

12 Claims, 6 Drawing Sheets

PROVISION OF CIRCUIT RESET WITHOUT A DEDICATED I/O PIN

BACKGROUND

The present invention concerns an apparatus and method which provides a circuit reset to an electronic device without the addition of a dedicated I/0 pin.

When powering up an electronic device, such as a very large scale integrated (VLSI) circuit, it is desirable to have the electronic device in a known state. For this reason reset circuitry is typically added to the electronic device.

For example, often an input/output (I/0) pin of the electronic device is dedicated to be used as a reset pin. This reset pin is connected, for example, to the active-low reset inputs of flip-flops within the electronic device. During initial power-up, the reset input is held at logic 0 This causes the flip-flops in the electronic device to be held in their reset state. Once the electronic device has been fully powered up, the reset pin is placed at logic 1, allowing the electronic device to operate.

However, electronic devices are limited in the number of I/0 pins which may be included. Often times there is no available I/0 pin which may be dedicated to use as a reset pin. In cases such as this, a power-on-reset circuit may be utilized.

A power-on-reset circuit detects when the electronic device on which the power-on-reset circuit resides is powered up. Once the power-on-reset circuit detects power up of the electronic device, the power-on-reset circuit holds its output at logic 0 for a period of time sufficient for the entire electronic device to receive full power-up. While the power-on-reset circuit holds its output at logic 0, the electronic device performs a reset. After the entire electronic device has received full power up, the power-on-reset raises its output to logic 1. When the power-on-reset raises its output to logic 1, the reset sequence is completed.

Power-on-reset circuits have several disadvantages. For example, the length of time after power-up that a power-on-reset circuit holds it output at logic 0 varies depending on processing factors, operating temperature and power supply voltages. Also, the reset may only be initiated when the electronic device is powered down. Additionally, a user has no control over the timing of the reset cycle.

Further, electronic devices are typically tested using automatic test equipment (ATE). Often times it is desirable for an ATE to loop through a number of test vectors, each of the test vectors beginning with a reset of the electronic device. Such vector looping is an important debugging and characterization procedure which is performed with power constantly applied to the electronic device under test. Unfortunately, use of a conventional power-on-reset circuit does not allow such vector looping because an electronic device including a conventional power-on-reset circuit does not issue a reset without the removing and then re-applying of power to the electronic device.

SUMMARY OF THE INVENTION

In accordance with the preferred embodiment of the present invention an electronic device is present which is reset using a reset line internal to the electronic device. The electronic device includes internal logic circuitry which performs logic operations. An internal logic power signal input to the electronic device is connected to an internal logic power signal line. The internal logic power signal line is used to deliver an internal logic power signal to the internal logic circuitry. The electronic device also includes a plurality of outputs. These may be dedicated outputs or may be used for both input and output. A plurality of output drivers buffer output signals generated by the internal logic circuitry. The output drivers place the output signals on the plurality of outputs.

The electronic device additionally includes an output power signal input connected to an output power signal line. The output power signal line is used to deliver an output power signal from the output power signal input to the output drivers. A reset line, connected to the output power signal line and to the internal logic circuitry, is used to reset the internal logic circuitry. For example, the reset line is connected to active low circuit resets throughout the internal logic circuitry. The reset line is connected to the output power signal line, for example, through a Schmit input level shifter. A reset cycle is begun by placing the internal logic power signal on the internal logic power signal line while placing a ground signal on the output power signal line. The reset cycle is completed by placing the output power signal on the output power signal line.

In an alternate embodiment of the present invention, the output power signal line may be used to indicate operation in a test mode. A storage device stores a value on the output power signal line. When the internal logic power signal is on the internal logic power signal line and a ground signal from the output power signal line is stored in the storage device, the electronic device operates in a test mode. When the internal logic power signal is one the internal logic power signal line and the output power signal is on the output power signal line and the storage element has been set to its normal operation mode, then the electronic device operates in a test mode. When more than one input is used to provide power to output drivers additional test modes may be added. In this case a decoder can be used which is connected between the storage device and the inputs which provide power to output drivers. When a ground signal for at least one of the plurality of power signal lines is stored in the storage device, a predetermined voltage is asserted on one of the test mode lines selected based on for which of the plurality of signal lines the ground signal is stored. A particular test mode is entered based on which test mode line is asserted.

DESCRIPTION OF THE PRIOR ART

Figure 1:
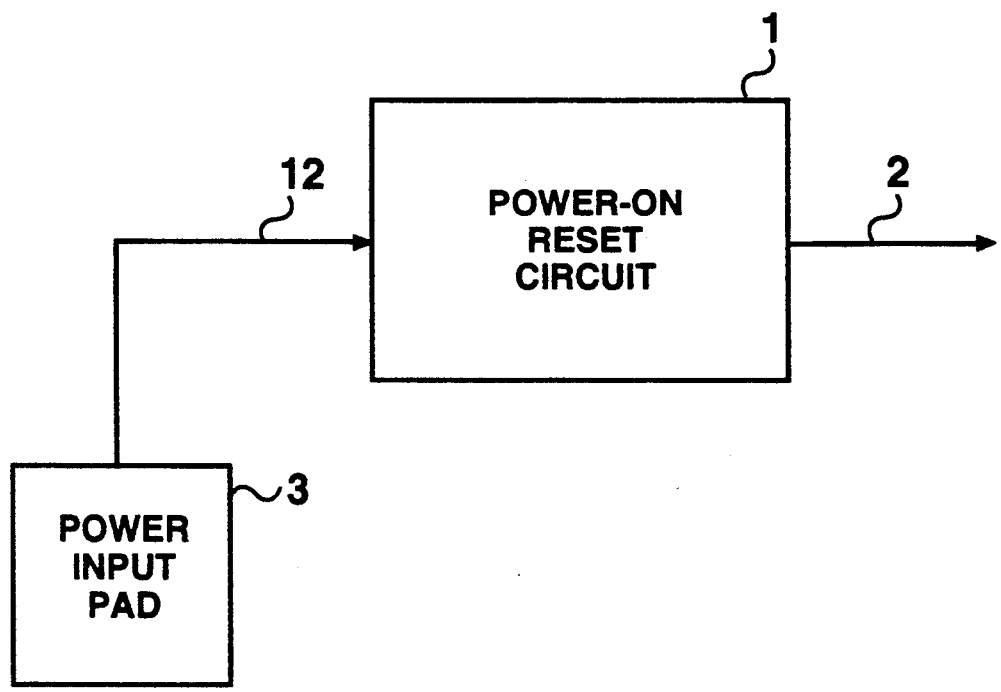
FIGS. 1 and 2 show a prior art implementation of a power-on-reset circuit.

FIG. 1 shows a block diagram of a conventional power-on-reset circuit 1. A power signal being placed on a power input pad 3 of an electronic device on which power-on-reset circuit 1 resides is forwarded to a reset power line 12 of power-on-reset circuit 1. Once the power signal is detected on reset power line 12, power-on-reset circuit 1 retains a reset output 2 low for a period of time sufficient for the entire electronic device to receive full power-up. While power-on-reset circuit 1 retains reset output 2 low, the electronic device performs a reset. After the entire electronic device has full power-up, power-on-reset 1 raises high reset output 2, at which time the electronic device completes the reset sequence.

Figure 2:
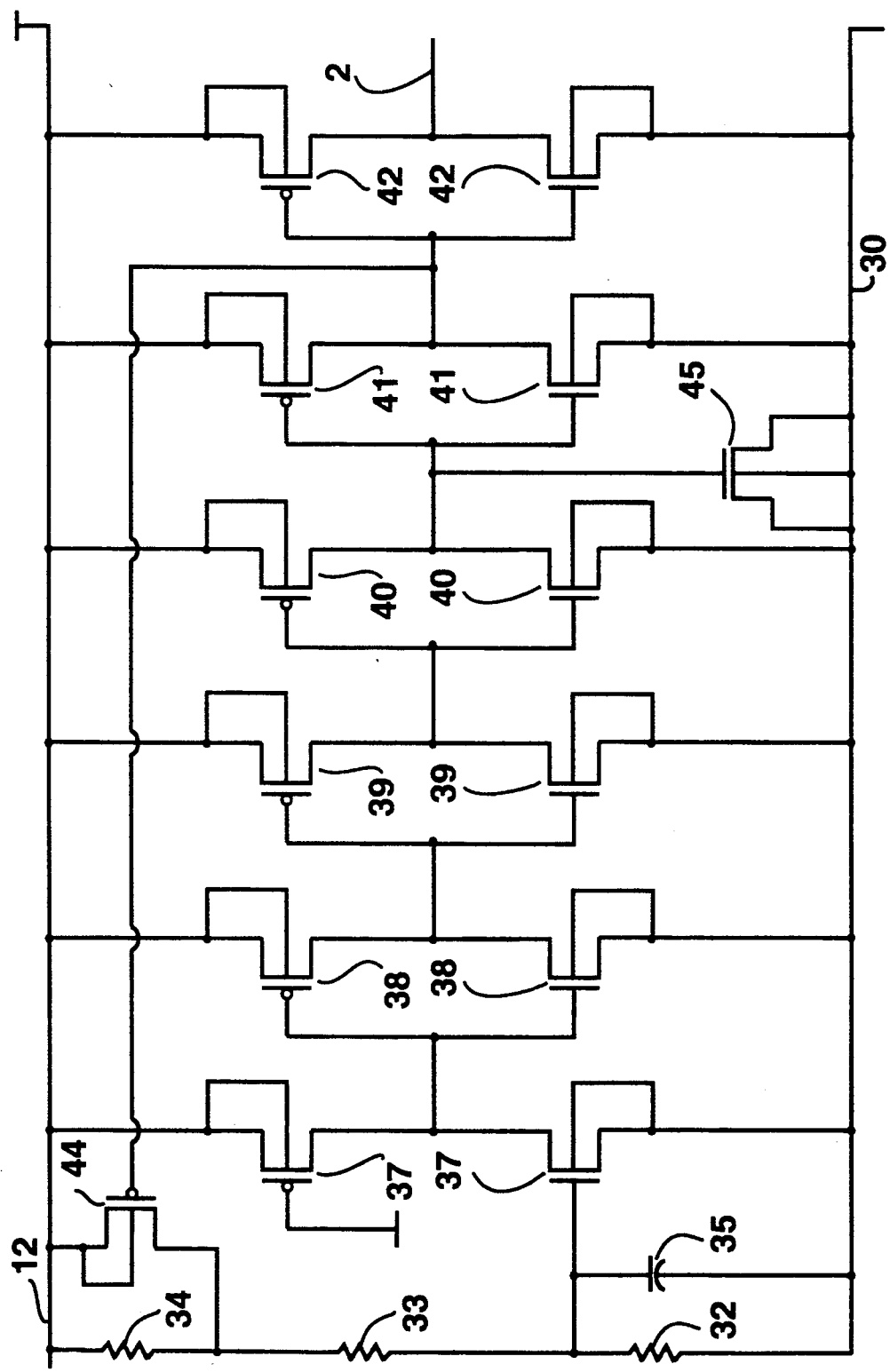

FIG. 2 shows a schematic of power-on-reset circuit 1. A transistor pair 37, a transistor pair 38, a transistor pair 39, a transistor pair 40, a transistor pair 41, and a transistor pair 42 form an inverter chain which provides delay through power-on-reset circuit 1. Power-on-reset circuit 1 also includes a resistor 32, a resistor 33, a capacitor 35, a transistor 44 and a transistor 45 connected as shown. Transistor 44 is used to raise the voltage on the gate of the n-channel transistor of transistor pair 37 by shunting the resistance of resistor 34. Transistor 45 is used to add capacitance to the output of transistor pair 40, thereby increasing the delay through the inverter chain.

DESCRIPTION OF THE PREFERRED EMBODIMENT

Figure 3:
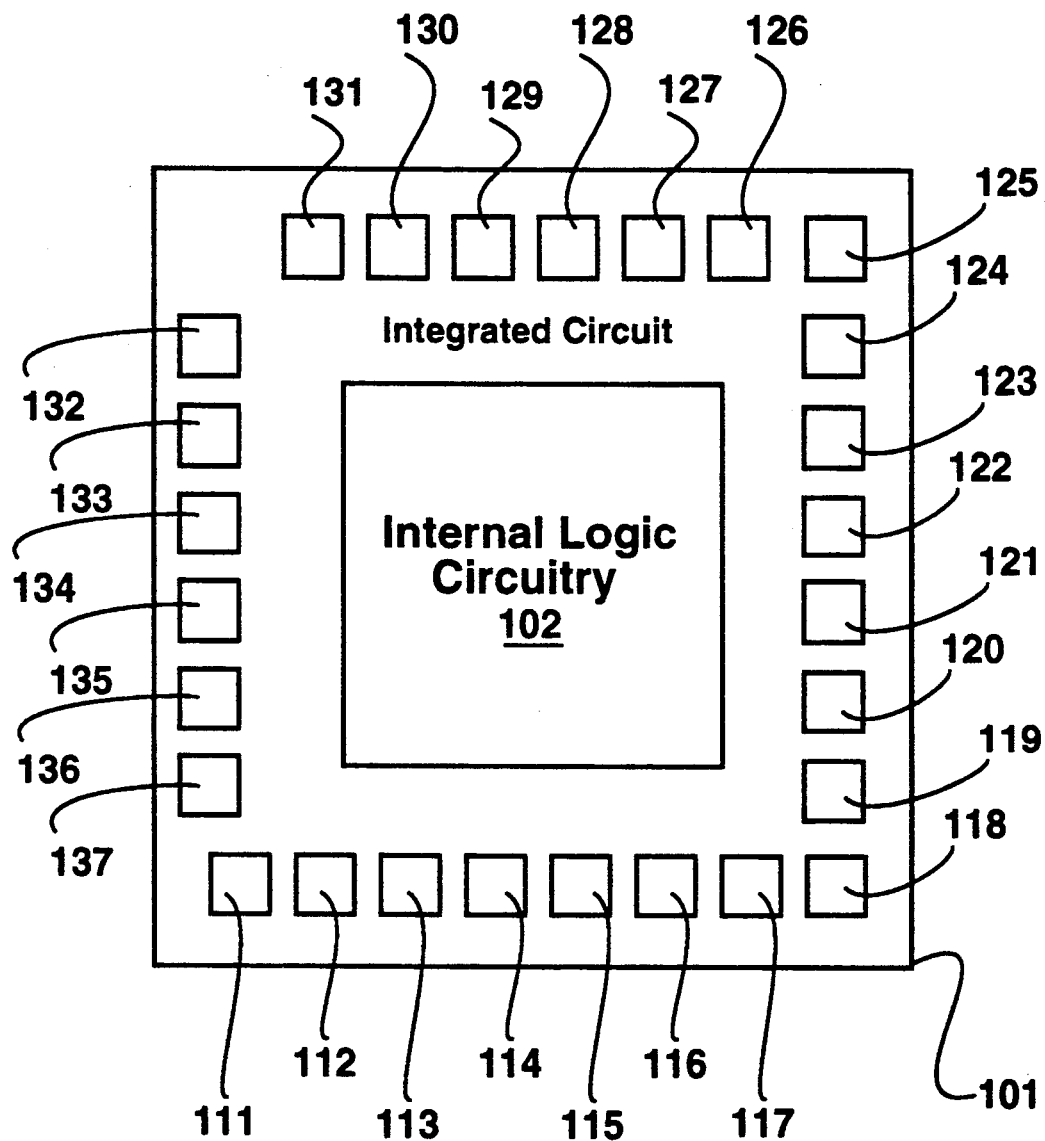
FIG. 3 shows a block diagram of I/0 pads on an integrated circuit.

FIG. 3, shows a block diagram of an integrated circuit chip 101. Internal logic circuitry 102 within integrated circuit chip 101 interacts with other integrated circuits through input/output (I/O) pads 114 through 137. The number and location of I/O pads on integrated circuit chip 101 are completely illustrative and do not necessarily reflect a particular type of integrated circuit design. Additional pads, represented by pads 111 through 113, rather than directly facilitating communication between internal logic circuitry 102 and other integrated circuits, are used for other miscellaneous tasks. For example, VSS pad 111 is used to supply a ground signal (VSS) used throughout integrated circuit 101. $VDD_i$ pad 113 is used to supply a power signal ($VDD_i$) which is used to supply power to internal logic circuitry 102. $VDD_o$ pad 112 is used to supply a power signal ($VDD_o$) for output drivers (also called output buffers) which drive voltage values onto I/O pads 114 through 137.

Figure 4:
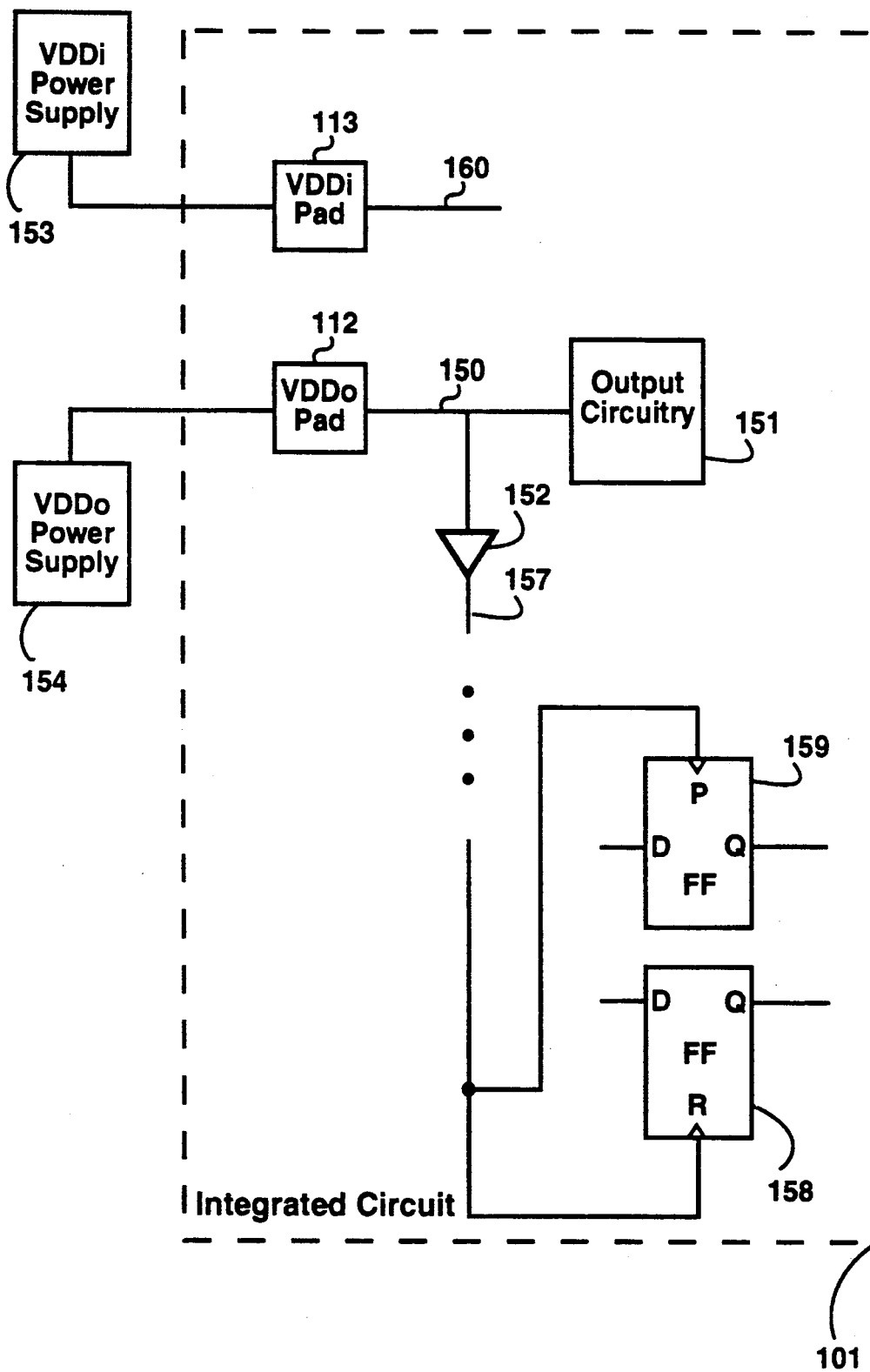
FIG. 4 shows reset circuitry for the integrated circuit shown in FIG. 3 being connected through a voltage shifter to a $VDD_o$ pad which is used to deliver power to output driver circuitry of the integrated circuit in accordance with a preferred embodiment of the present invention.

In FIG. 4, $VDD_i$ pad 113 is shown connected to a $VDD_i$ power bus 160. Power bus 160 is connected to circuits throughout internal logic circuitry 102 in order to supply a $VDD_i$ power signal to the circuits. $VDD_o$ pad 112 is shown connected to a $VDD_o$ power bus 150. Power bus 150 is used to supply a $VDD_o$ power signal to output driver circuitry 151. Output driver circuitry 151 includes output buffers which are used to drive voltage values onto I/O pads drivers.

In the present invention, $VDD_i$ pad 113 is electrically isolated from $VDD_o$ pad 112. This means $VDD_i$ pad 13 is not bonded to the same package lead as $VDD_i$ pad 113. Further, on a circuit board which includes integrated circuit chip 101, separate power supplies must be used. For example, a $VDD_i$ power supply 153 which supplies power to $VDD_i$ pad 113 is shown separated from a $VDD_o$ power supply 154 which supplies power to $VDD_o$ pad 112. In order to facilitate resetting internal logic circuitry 102, $VDD_o$ power bus 150 is tapped by a Schmit input level shifter 152. Schmit input level shifter 152 reduces any noise on $VDD_o$ power bus 150 and generates a reset signal which is placed on a reset signal line 157. Reset signal line 157 is connected to reset inputs of circuitry throughout internal logic circuitry 102. For example, a flip-flop 158 and a flip-flop 159 represent circuitry within internal logic circuitry 102. Reset signal line 157 is connected to an active low reset input within flip-flop 158.

With the arrangement shown in FIG. 4, upon power-up, $VDD_i$ power supply 153 will place a $VDD_i$ power signal, for example 5 volts (logic 1), onto $VDD_i$ pad 113. However, $VDD_o$ power supply 154 maintains a ground signal, for example 0 volts, upon $VDD_o$ pad 112. The result is that throughout internal logic circuitry 102, the logical circuits are maintained at reset during power-up. The only circuitry which will not be powered up during this period is output driver circuitry 151. However, the output buffers within output driver circuitry 151 do not need to be powered up during reset.

When internal logic circuitry 102 is completely powered up, $VDD_o$ power supply 154 places the $VDD_o$ power signal (for example, 5 volts) on $VDD_o$ pad 112. This results in releasing the reset on circuits throughout internal logic circuitry 102 and also supplies power to output driver circuitry 151.

The above-described method for providing a circuit reset to an electronic device allows the time of a reset period to be controlled from $VDD_o$ power supply 154. This allows a user to control the time of reset on power up and minimizes the effects of process, temperature and voltage sensitivities of the electronic device.

Also, using $VDD_o$ power supply 154, a reset can be generated without powering down internal logic circuitry 102. During the reset $VDD_o$ power supply 154 places a ground signal on $VDD_o$ pad 112 while $VDD_i$ power supply 153 retains a 5 volt power signal on $VDD_i$ pad 113. To complete the reset, power supply 154 returns the $VDD_o$ power signal to $VDD_o$ pad 112. This reset can be used, for example, during testing when it is desirable to generate a reset without removing power from internal logic circuitry 102.

Figure 5:
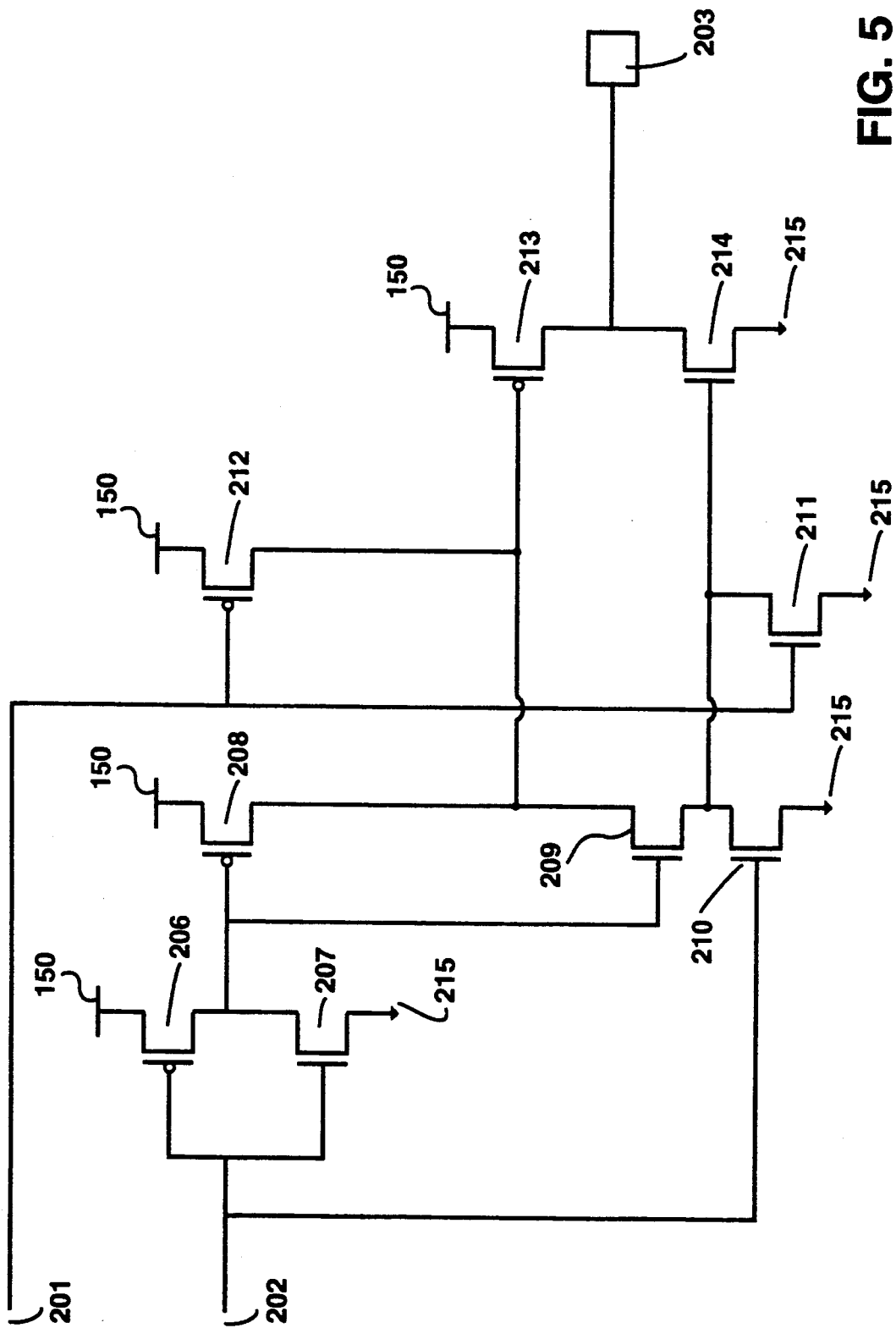
FIG. 5 shows detail of output driver circuitry shown in FIG. 4 in accordance with a preferred embodiment of the present invention.

FIG. 5 shows an implementation of output driver circuitry 151 for a single I/0 pad 203 of a CMOS device. Under normal operating conditions, values are placed on an I/0 pad 203 in accordance with values on an output value line 201 and an output enable line 202. A p-gate transistor 213 and an n-gate transistor 214 serve as an output driver for I/0 pad 203. Each of n-gate transistor 214 and p-gate transistor 213 is able to drive an amount of current as selected by the user. A reference voltage 215 connected to n-gate transistor 214 is at ground (logic 0).

When output enable line 202 is held at logic 1, output to I/0 pad 203 is disabled. This is accomplished as follows. When output enable line 202 is at logic 1, an n-gate transistor 210 is turned on. When n-gate transistor 210 is on, a gate of n-gate transistor 214 is held at logic 0, turning off n-gate transistor 214. Also, when output enable line 202 is at logic 1, an inverter consisting of a p-gate transistor 206 and an n-gate transistor 207 places a logic 0 on a gate of p-gate transistor 208. This turns on p-gate transistor 208. When p-gate transistor 208 is on, a gate of p-gate transistor 213 is held at logic 1, turning off p-gate transistor 213. Also, an n-gate transistor 209 is turned off isolating the gate of p-gate transistor 213 from n-gate transistor 14, allowing both p-gate transistor 213 and n-gate transistor 214 to be turned off simultaneously. When both p-gate transistor 213 and n-gate transistor 214 are turned off, output to I/0 pad 203 is disabled.

When output enable line 202 is held at logic 0, output to pad 213 is enabled. When output enable line 202 is held at logic 0, n-gate transistor 210 is turned off, p-gate transistor 208 is turned off and n-gate transistor 209 is turned on. Then, the logic value placed on the gate of p-gate transistor 213 and n-gate transistor 214 is controlled by a p-gate transistor 212 and an n-gate transistor 211. N-gate transistor 211 and p-gate transistor 212 invert the logic value placed on output value line 201 and place the inverted logic value on the gate of p-gate transistor 213 and the gate of n-gate transistor 214. The inverted logic value on the gate of p-gate transistor 213 and n-gate transistor 214 is inverted by n-gate transistor 214 and p-gate transistor 213 and placed on I/0 pad 203.

$VDD_o$ power bus 150 is connected to p-gate transistor 206, p-gate transistor 208, p-gate transistor 212 and p-gate transistor 213. Under normal operating conditions, $VDD_o$ power bus 150 is at logic 1, for example five volts. During reset, $VDD_o$ power bus 150 is at logic 0, for example zero volts.

Variation of the present invention ca be used to generate different test modes. In electronic devices which utilize one or more $VDD_o$ pads to supply $VDD_o$ power signals to output driver circuitry, the $VDD_o$ power signal(s) can be tapped to generate various test modes.

Figure 6:
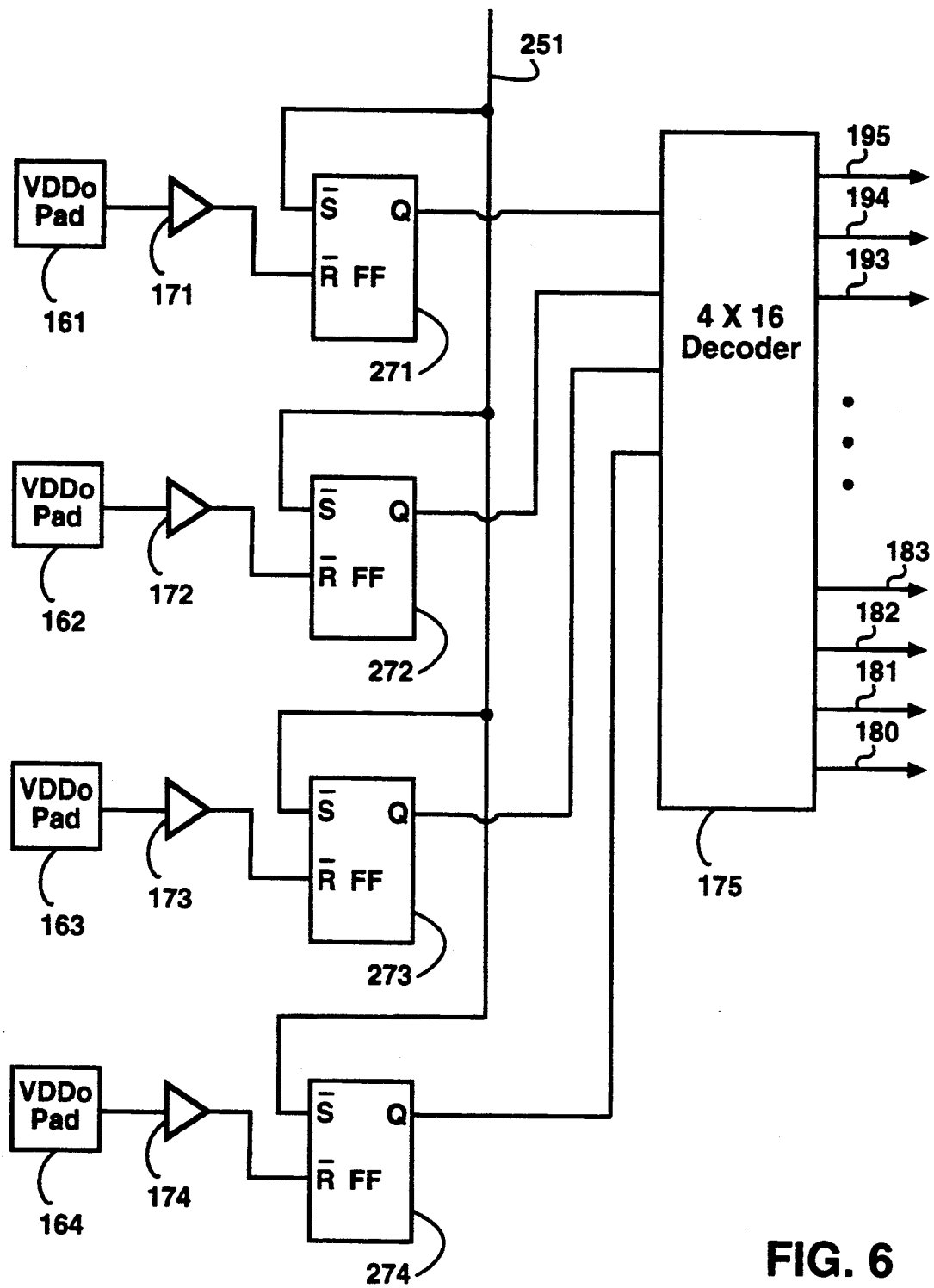
FIG. 6 shows test mode generation circuitry being connected through voltage shifters to $VDD_o$ pads which are used to deliver power to output driver circuitry in accordance with an alternate preferred embodiment of the present invention.

For example, FIG. 6 shows a system in which four separate $VDD_o$ power signals are used. The separate $VDD_o$ power signals are placed on a $VDD_o$ pad 161, a $VDD_o$ pad 162, a $VDD_o$ pad 163 and a $VDD_o$ pad 164. Because, it is necessary to use output driver circuitry during testing, values on $VDD_o$ pad 161, $VDD_o$ pad 162, $VDD_o$ pad 163 and $VDD_o$ pad 164 are stored respectively in an RS flip-flop 271, an RS flip-flop 272, an RS flip-flop 273 and an RS flip-flop 274. RS flip-flop 271 receives a first $VDD_o$ power signal on $VDD_o$ pad 161 through a Schmit input level shifter 171. RS flip-flop 272 receives a second $VDD_o$ power signal on $VDD_o$ pad 162 through a Schmit input level shifter 172. RS flip-flop 273 receives a third $VDD_o$ power signal on $VDD_o$ pad 163 through a Schmit input level shifter 173. RS flip-flop 274 receives a fourth $VDD_o$ power signal on $VDD_o$ pad 164 through a Schmit input level shifter 174.

During a test mode set up cycle, any one of $VDD_o$ pad 161, $VDD_o$ pad 162, $VDD_o$ pad 163 and $VDD_o$ pad 164 can be toggled low and respectively RS flip-flop 271, RS flip-flop 272, RS flip-flop 273 and RS flip-flop 274 will store this transition. Once the values have been stored in RS flip-flop 271, RS flip-flop 272, RS flip-flop 273 and RS flip-flop 274, a power signal is placed on each of $VDD_o$ pad 161, $VDD_o$ pad 162, $VDD_o$ pad 163 and $VDD_o$ pad 164. A select signal may be placed on select line 251 when it is desirable to initialize integrated circuit 101 to its normal operating mode.

Four-to-sixteen decoder 175 decodes the four $VDD_o$ power signals stored in RS flip-flop 271, RS flip-flop 272, RS flip-flop 273 and RS flip-flop 274 into up to fifteen different test mode signals and one normal operating mode signal which are each placed on one of sixteen output lines of four-to-sixteen decoder 175. The sixteen output lines of four-to-sixteen decoder 175 are represented by an output line 180, an output line 181, an output line 182, an output line 183, an output line 193, an output line 194 and an output line 195. Such a system allows up to fifteen test modes to be defined in addition to the normal operating mode.

The number of possible test modes varies dependent on that number of $VDD_o$ power signal lines. For example, if there is only one $VDD_o$ power signal line, then only a single test mode and a single operating mode would be available unless, for instance, a voltage detector connected to the $VDD_o$ power signal line was able to detect additional voltage levels.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. An electronic device which is reset using a reset line internal to the electronic device, electronic device comprising:

internal logic circuitry;

an internal logic power signal input to the electronic device, an internal logic power signal line, coupled to the internal logic power signal input and to the internal logic circuitry, the internal logic power signal line being used to deliver an internal logic power signal to the internal logic circuitry;

a plurality of outputs;

a plurality of output drivers, coupled to the plurality of outputs and to the internal logic circuitry, the plurality of output drivers buffering output signals generated by the internal logic circuitry and placed on the plurality of outputs;

an output power signal input to the electronic device;

an output power signal line, coupled to the output power signal input and to the plurality of output drivers, the output power signal line being used to deliver an output power signal to the output drivers; and, a reset line, coupled to the output power signal line and the internal logic circuitry, the reset line being used to reset the internal logic circuitry;

wherein a reset cycle is begun by placing the internal logic power signal on the internal logic power signal line while placing a ground signal on the output power signal line and the reset cycle is completed by placing the output power signal on the output power signal line.

2. An electronic device as in claim 1 wherein the output power signal line is coupled to the reset line through a Schmit input level shifter.

3. A method for providing a reset signal to an electronic device, the method comprising the steps of:

(a) providing two separate power signals for the electronic device, wherein an internal logic power signal on an internal logic power signal line is used to provide power to internal logic circuitry within the electronic device and an output power signal on an output power signal line is used to provide power to output buffers which are used by the electronic device to place signals on outputs of the electronic device;

(b) coupling the output power signal line to a reset line for the electronic device;

(c) beginning a reset cycle by placing the internal logic power signal on the internal logic power signal line while placing a ground signal on the output power signal line; and (d) completing the reset cycle by placing the output power signal on the output power signal line.

4. A method as in claim 3 wherein in step (b) the output power signal line is coupled to the reset line through a Schmit input level shifter.

5. A method for providing a test mode within an electronic device, the method comprising the steps of:

(a) providing two separate power signals for the electronic device, wherein an internal logic power signal on an internal logic power signal line is used to provide power to internal logic circuitry within the electronic device and an output power signal on an output power signal line is used to provide power to output buffers which are used by the electronic device to place output signals on outputs of the electronic device;

(b) storing a value on the output power signal line;

(c) operating in a test mode when the internal logic power signal is on the internal logic power signal line and a ground signal is stored from the output power signal line; and, (d) operating in a normal operating mode when the internal logic power signal is on the internal logic power signal line and the output power signal is stored from the output power signal line.

6. A method for providing for a plurality of test modes within an electronic device, the method comprising the steps of:

(a) providing separate power signals for the electronic device, wherein an internal logic power signal on an internal logic power signal line is used to provide power to internal logic circuitry within the electronic device and a plurality of output power signals on a plurality of output power signal lines are used to provide power to output buffers which are used by the electronic device to place signals on outputs of the electronic device;

(b) storing values from the plurality of output power signal lines;

(c) operating in one of a plurality of test modes when the internal logic power signal is on the internal logic power signal line and there is a ground signal stored from at least one of the plurality of output power signal lines; and, (d) operating in a normal operating mode when the internal logic power signal is on the internal logic power signal line and an output power signal is stored for each of the plurality of output power signal lines.

7. An electronic device which has a test mode, the electronic device comprising:

internal logic circuitry;

an internal logic power signal input to the electronic device, an internal logic power signal line, coupled to the internal logic power signal input and to the internal logic circuitry, the internal logic power signal line being used to deliver an internal logic power signal to the internal logic circuitry;

a plurality of outputs;

a plurality of output drivers, coupled to the plurality of outputs and to the internal logic circuitry, the plurality of output drivers buffering output signals generated by the internal logic circuitry and placed on the plurality of outputs;

an output power signal input to the electronic device;

an output power signal line, coupled to the output power signal input and to the plurality of output drivers, the output power signal line being used to deliver an output power signal to the output drivers; and, storage means, coupled to the output power signal line for storing a value on the output power signal line;

a test mode line, coupled to the storage means and to the internal logic circuitry, the test mode line being used to place the internal logic circuitry in the test mode;

wherein the internal logic circuitry operates in the test mode when the value stored in the storage means is the internal logic power signal and a ground signal is on the output power signal.

8. An electronic device as in claim 7 wherein the output power signal line is coupled to the storage means through a Schmit input level shifter.

9. An electronic device as in claim 7 wherein the test mode is one in a plurality of test modes, the test mode line is one in a plurality of test mode lines and the output power signal line is one in a plurality of power signal lines which are used to deliver power to the plurality of output drivers, and wherein the electronic device additionally comprises:

decoder means, coupled between the storage means and the plurality of test mode lines, for, when a ground signal for at least one of the plurality of power signal lines is stored in the storage means, asserting a predetermined voltage on one of the test mode lines selected based upon which of the plurality of signal lines is placed the ground signal.

10. An electronic device as in claim 9 wherein the plurality of power signal lines are coupled to the storage means through a plurality of Schmit input level shifters.

11. An electronic device as in claim 9 wherein the storage means is a plurality of RS flip-flops.

12. An electronic device as in claim 9 wherein the storage means is an RS flip-flop.

* * * * *